United States Patent
Chu et al.

(10) Patent No.: US 10,998,010 B2
(45) Date of Patent: *May 4, 2021

(54) SYSTEMS FOR DISCHARGING LEAKAGE CURRENT OVER A RANGE OF PROCESS, VOLTAGE, TEMPERATURE (PVT) CONDITIONS

(71) Applicant: Micron Technology, Inc., Boise, ID (US)

(72) Inventors: Wei Lu Chu, Xuhui District (CN); Dong Pan, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/823,079

(22) Filed: Mar. 18, 2020

(65) Prior Publication Data
US 2020/0327913 A1 Oct. 15, 2020

Related U.S. Application Data

(63) Continuation of application No. 16/384,433, filed on Apr. 15, 2019, now Pat. No. 10,614,860.

(51) Int. Cl.
*G11C 5/14* (2006.01)
*G11C 11/4074* (2006.01)

(52) U.S. Cl.
CPC ............ *G11C 5/14* (2013.01); *G11C 11/4074* (2013.01)

(58) Field of Classification Search
CPC .............................. G11C 5/14; G11C 11/4074
See application file for complete search history.

(56) References Cited

U.S. PATENT DOCUMENTS

| | | | |
|---|---|---|---|
| 6,337,824 B1* | 1/2002 | Kono | G11C 11/406 |
| | | | 257/E27.097 |
| 7,123,113 B1 | 10/2006 | Brennan et al. | |
| 7,940,577 B2 | 5/2011 | Shimogawa et al. | |
| 7,965,128 B2 | 6/2011 | Yamamoto | |
| 10,331,151 B1 | 6/2019 | Chu | |
| 10,614,860 B1* | 4/2020 | Chu | G11C 5/147 |
| 2006/0097774 A1 | 5/2006 | Hasegawa | |

(Continued)

OTHER PUBLICATIONS

U.S. Appl. No. 16/387,146, filed Apr. 17, 2019, Wei Lu Chu.

*Primary Examiner* — Toan K Le
(74) *Attorney, Agent, or Firm* — Fletcher Yoder, P.C.

(57) ABSTRACT

Systems and devices are provided for fully discharging leakage current generated during standby and/or power down modes regardless of variations in PVT conditions. An apparatus may include a power generation unit that powers components of the apparatus and a bleeder circuit. The bleeder circuit may include an operational amplifier. Further, the bleeder circuit may include leakage current generator circuitry that is coupled to the operational amplifier and generates a first current that mimics leakage current generated by the power generation unit. Furthermore, the bleeder circuit may include leakage current mirroring circuitry that is coupled to an output of the operational amplifier and that generates a second current that mirrors the first current. In addition, the bleeder circuit may also include leakage current bleeder circuitry that is coupled to the leakage current mirroring circuitry and that generates a third current that sinks the leakage current to ground.

20 Claims, 4 Drawing Sheets

(56) References Cited

U.S. PATENT DOCUMENTS

| | | |
|---|---|---|
| 2009/0121699 A1 | 5/2009 | Park et al. |
| 2010/0109762 A1* | 5/2010 | Im .................. G11C 11/4074 |
| | | 327/543 |
| 2015/0108953 A1 | 4/2015 | Kobayashi et al. |
| 2016/0161969 A1 | 6/2016 | Kwon |

* cited by examiner

SYSTEMS FOR DISCHARGING LEAKAGE CURRENT OVER A RANGE OF PROCESS, VOLTAGE, TEMPERATURE (PVT) CONDITIONS

CROSS REFERENCE TO RELATED APPLICATIONS

This application is a continuation of U.S. Non-Provisional application Ser. No. 16/384,433, entitled "SYSTEMS FOR DISCHARGING LEAKAGE CURRENT OVER A RANGE OF PROCESS, VOLTAGE, TEMPERATURE (PVT) CONDITIONS," filed Apr. 15, 2019, which is hereby incorporated by reference in its entirety for all purposes.

BACKGROUND

The present disclosure relates generally to the field of bleeder circuits and, more particularly, to techniques for fully discharging leakage current generated during standby and/or power down modes regardless of variations in process, voltage, temperature (PVT) conditions.

This section is intended to introduce the reader to various aspects of art that may be related to various aspects of the present techniques, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Electronic devices, such as semiconductor devices, memory chips, microprocessor chips, image chips, and the like, may include circuitry that performs various operations based on a provided voltage and current. In some instances, the voltage and current provided to the circuitry may be cut-off when the semiconductor device enters a standby mode and/or a powered down mode (e.g., turn-off modes), for example, to reduce battery consumption. During turn-off however, current may still flow in portions of the circuitry due to physics of circuit components. This current may result in unwanted electrical behavior, such as charging of portions of the circuitry. To reduce the unwanted electrical behavior, a bleeder circuit may be used to sink the current to ground.

BRIEF DESCRIPTION OF DRAWINGS

Various aspects of this disclosure may better be understood upon reading the following detailed description and upon reference to the drawings in which.

DETAILED DESCRIPTION

Figure 1:
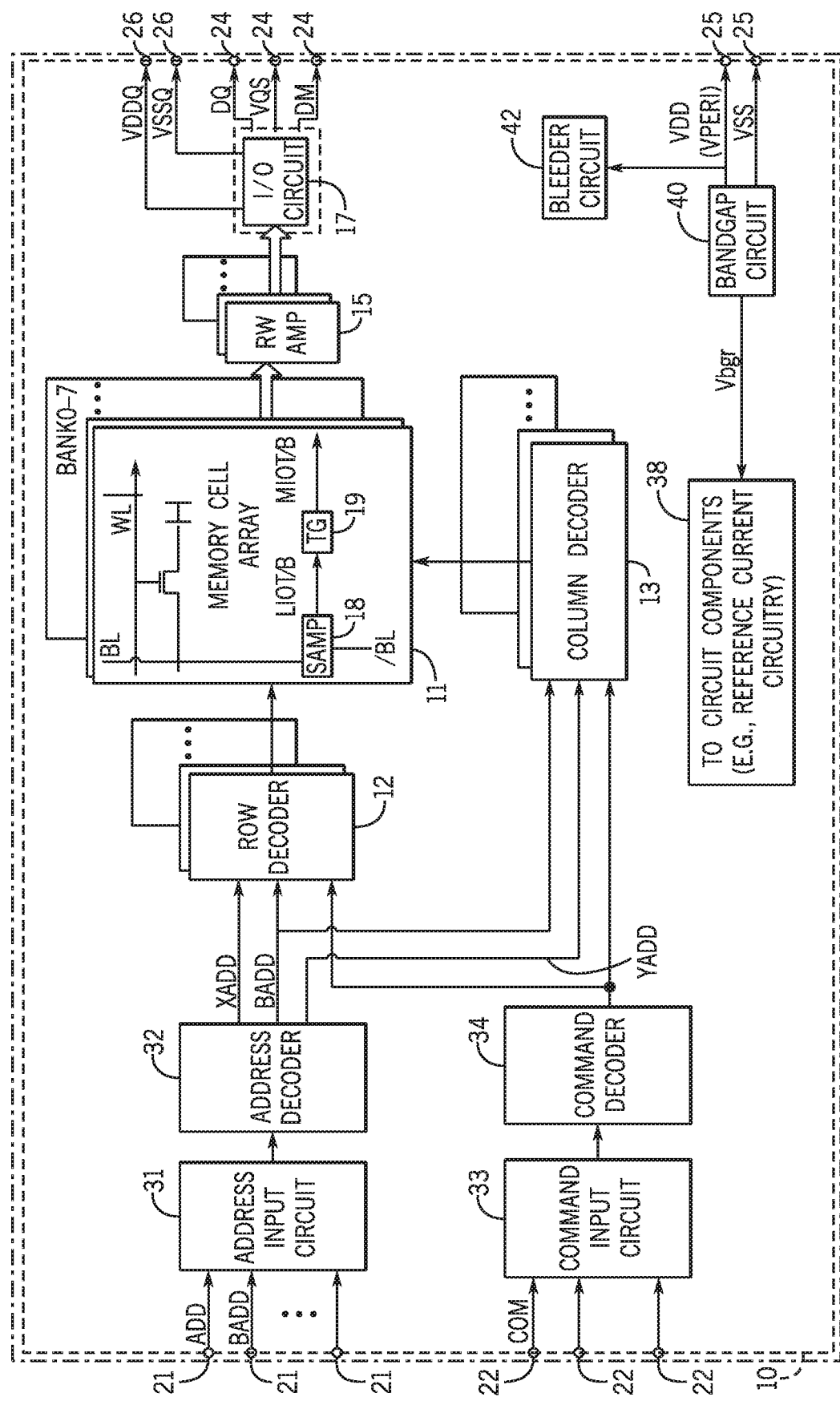
FIG. 1 is a simplified block diagram illustrating a semiconductor device that includes a bleeder circuit, in accordance with an embodiment of the present disclosure.

One or more specific embodiments will be described below. To provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features.

The present disclosure generally relates to electronic devices that employ power amplifiers to power portions of the electronic device and bleeder circuits to discharge leakage current generated by the power amplifiers. Generally, electronic devices may include one or more power operational amplifiers that generate an amplified output to drive circuitry within the electronic device. For example, semiconductor devices, such as high bandwidth memory (HBM) devices, may include many high-gain power amplifiers to provide high-magnitude operation current to the rest of the semiconductor device. Each power amplifier may include one or more P-type metal-oxide semiconductor (PMOS) transistors that each generate a large current output to provide the high-magnitude operation current.

When the semiconductor device enters a standby mode and/or a powered down mode (e.g., turn-off modes), for example, to reduce battery consumption, the power amplifiers may be disabled. In particular, gate terminals of the PMOSs may be coupled (e.g., pulled up) to an external voltage source (e.g., drain to drain voltage (VDD), peripheral voltage (VPERI)) that is used to drive a source terminal of the PMOSs. Once the gate terminal and the source terminal of the PMOS are at nearly equivalent voltages, the PMOS will be effectively off as the voltage difference between the gate terminal and the source terminal (e.g., Vgs) is no longer below an operating voltage threshold. That is, because the potential at the terminals is no longer large enough to drive carriers, active current will not flow through the PMOS.

However, even when the PMOS is effectively off, leakage current may still flow through the transistor. In particular, due to non-ideal behavior of the PMOS, unwanted current may flow through the PMOS device. For example, the leakage current may include current that flows due to formation of a reverse bias between diffusion regions and wells of the PMOS when the PMOS is turned-off (e.g., junction leakage). As another example, the leakage current may include current that flows between a drain terminal and the source terminal of the PMOS due to scaling of the supply voltage at the source terminal with transistor size (e.g., subthreshold conduction). Additionally or alternatively, the leakage current may include current that flows between the terminals due to a breakdown of a dielectric layer at the gate terminal (e.g., gate-oxide leakage).

Regardless, the leakage current magnitude may vary with variations in voltage applied to the PMOS, current flowing through the PMOS, environmental temperature, and the like. In other words, variations in PVT conditions may cause variations in the leakage current magnitude. For example, at higher temperature, more carriers at the diffusion region may become free, thereby resulting in an increased junction leakage current. It should be appreciated that while the present disclosure makes reference to a PMOS, any circuit components (e.g., N-type metal-oxide semiconductor (NMOS)) that may allow for leakage current is contemplated in the present disclosure.

In some instances, a bleeder circuit may be used to sink the leakage current to ground to prevent the leakage current from charging a portion of the semiconductor device. The bleeder circuit may use a resistor or a fixed pull-down current to sink the leakage current to ground. However, because the leakage current may vary with variations in process, voltage, and temperature (PVT) conditions, as described above, the resistor and/or the fixed pull-down current techniques, which cannot track the changes in the leakage current, may not adequately sink the entirety of the leakage current to ground for all testable PVT conditions.

For example, when variations in PVT conditions cause the leakage current to be of 1 miliAmp (mA), but a resistor of the bleeder circuit is capable of only sinking 500 micro-Amps (uA), the remaining 500 uA may cause a voltage of a power line bus in the semiconductor device to increase. As another example, if the pull-down current is significantly greater than the leakage current, the voltage of the power line bus may also be pulled to ground since there is not adequate current capacity. Thus, the inability of the bleeder circuit to track the mismatch between the PVT conditions, the leakage current, and current sink capacity may result in reduced performance of the semiconductor device.

Additionally or alternatively, temperature sensors may be used to control the value of the resistor and/or the value of the pull-down current. However, inclusion of the temperature sensor may increase design complexity, implementation costs, and consume relatively large amounts of space within the semiconductor device. For example, determining a trip point between the temperature and an appropriate current sink magnitude at a temperature may be difficult as the relation between the temperature and the leakage current is usually non-linear.

Accordingly, the present disclosure provides systems and techniques for discharging leakage current across various PVT conditions, including corner cases, by using a bleeder circuit that tracks the leakage current and mirrors the leakage current to a sink within the bleeder circuit. In some embodiments, the bleeder circuit may include a single operational amplifier that facilitates tracking and mimic the leakage current to the sink. In particular, the operational amplifier may be coupled to a PMOS unit that mimics the leakage current generated, for example, by eight PMOS transistors of a power amplifier.

Further, in some embodiments, the operational amplifier may facilitate replication of the mimicked leakage current at a first NMOS that acts as a breaker circuit. The leakage current at the first NMOS may be mirrored to a second NMOS that acts as the sink. In some embodiments, the second NMOS may generate a bleeder current that is thirty-two times the magnitude of the leakage current, thereby ensuring that the leakage current is adequately discharged to ground when the semiconductor device is in a turned-off mode. Further, the bleeder current, because it is based on the leakage current itself, may track the leakage current across PVT conditions, and thus, may adjust the current sink such that the power line bus voltage remains at a consistent voltage. Additional details with regard to discharging leakage current across variations in PVT conditions will be described below with reference to FIGS. 1-4.

With this in mind, FIG. 1 illustrates a semiconductor device 10 that includes a bleeder circuit, in accordance with an embodiment of the present disclosure. Although the following description of the semiconductor device 10 will be described in the context of a memory device, it should be noted that the embodiments described herein may be employed for any suitable electronic device. Indeed, the description of the memory device below is provided to explain certain aspects of the bleeder circuit of the present disclosure, and, as such, the embodiments described herein should not be limited to memory devices.

The semiconductor device 10 may be any suitable memory device, such as a low power double data rate type 4 (LPDDR4) synchronous dynamic random-access memory (SDRAM) integrated onto a single semiconductor chip, a low power double data rate type 5 (LPDDR5), or a high bandwidth memory (HBM) device. The semiconductor device 10 may be mounted on an external substrate 2, such as a memory module substrate, a motherboard, and the like. The semiconductor device 10 may include a plurality of memory banks each having a plurality of memory cell arrays 11. Each memory cell array 11 may include a plurality of word lines WL, a plurality of bit lines BL, and a plurality of memory cells MC arranged at intersections of the plurality of word lines WL and the plurality of bit lines BL. The selection of the word line WL is performed by a row decoder 12 and the selection of the bit line BL is performed by a column decoder 13. Sense amplifiers (SAND) 18 are coupled to corresponding bit lines BL and connected to local input/output (I/O) line pairs LIOT/B. Local IO line pairs LIOT/B are connected to main IO line pairs MIOT/B via transfer gates (TG) 19, which function as switches to control signal flow.

The semiconductor device 10 may also include a plurality of external terminals, which may communicate with other electrical components/devices. The external terminals may, in turn, include address terminals 21, command terminals 22, data terminals 24, and power supply terminals 25, 26. In particular, the address terminals 21 are supplied with an address signal ADD and a bank address signal BADD. The address signal ADD and the bank address signal BADD supplied to the address terminals 21 are transferred via an address input circuit 31 to an address decoder 32. The address decoder 32 receives the address signal ADD and supplies a decoded row address signal XADD to the row decoder 12 as well as a decoded column address signal YADD to the column decoder 13. The address decoder 32 also receives the bank address signal BADD and supplies the bank address signal BADD to the row decoder 12 and the column decoder 13.

The command terminals 22 are supplied with a command signal COM. The command signal COM may include one or more separate signals. The command signal COM input to the command terminals 22 is transferred to a command decoder 34 via the command input circuit 33. The command decoder 34 decodes the command signal COM to generate various internal command signals. For example, the internal commands may include a row command signal to select a word line WL and a column command signal, such as a read command or a write command, to select a bit line BL. Additionally, the data terminals 24 may be coupled to output buffers for read operations of memories or to input buffers for read/write access of the memories.

Although the address terminals 21 and the command terminals 22 are illustrated as separate terminals, it should be appreciated that in some embodiments, the address input circuit 31 and the command input circuit 33 may receive address signals ADD and command signals COM via the same terminal. For instance, the address and command terminals may provide an address signal at a falling clock edge (e.g., in synchronism with clock falling edge) and a command signal at a rising clock edge (e.g., in synchronism with clock rising edge). Further, the data terminals 24 may also be a single terminal that alternatively receives data signals (DQ, DQS, DM).

Accordingly, the address signals ADD, BADD and the command signals COM may be used to access a memory cell MC in the memory cell array 11. As an example, when a command signal COM indicating a read operation is timely supplied to a word line WL and a bit line BL designated by a respective row address and column address of the address signal ADD, data may be read from the memory cell MC associated with the row address and column address. The read data DQ may be output externally from the data terminals 24 via a read/write amplifier 15 and an input/output circuit 17. Similarly, when a command signal COM indicating operation is timely supplied to a word line WL and a bit line BL designated by a respective row address and column address of the address signal ADD, data DQ may be written to the memory cell MC associated with the row address and column address. The write data DQ may be supplied to the memory cell MC after being received from the data terminals 24, the input/output circuit 17, and the read/write amplifier 15.

In some embodiments, the input/output circuit 17 may include input buffers that store data for processing and/or transmission. Further, the input/output circuit 17 receives a timing signal from an external clock that controls input timing of read data DQ and output timing of write data DQ. The input/output circuit 17 may be powered using dedicated power supply potentials VDDQ and VSSQ, such that power supply noise generated by the input/output circuit 17 does not propagate to the other circuit blocks. The power supply potentials VDDQ and VSSQ may be of the same potentials as power supply potentials VDD and VSS that are supplied to power supply terminals 25, respectively.

In particular, the power supply potentials VDD (e.g., VPERI) 25 and VSS 25 may be supplied to a bandgap circuit 40. In some embodiments, the bandgap circuit 40 may output a constant (e.g., fixed) voltage ($V_{bgr}$) independent of process variations (e.g., circuit loading), power supply variations, temperature changes, and the like. In other words, the $V_{bgr}$ voltage may be independent of PVT condition variations. The bandgap circuit 40 may generate various internal potentials VPP, VOD, VARY that are provided to circuit elements of the semiconductor device 10. For example, the internal potential VPP may be mainly used in the row decoder 12 and the reference current circuitry 38 and the internal potentials VOD and VARY may be mainly used in the sense amplifiers 18 included in the memory cell array 11.

The power supply potentials VDD (e.g., VPERI) 25 may also be supplied to a bleeder circuit 42 that facilitates discharge of the leakage current within the semiconductor device 10. For example, the semiconductor device 10 may include multiple power amplifiers that in turn include transistors, such as PMOSs. The PMOSs may generate the leakage current when the semiconductor device 10 is in a turned-off mode due to transistor physics. If the leakage current is unable to find a path to ground, the leakage current may charge (e.g., vary the voltage) portions of the circuitry of the semiconductor device 10, reducing performance of the semiconductor device 10 and/or lifespan of the circuit components. As such, the bleeder circuit 42 may be used to sink the leakage current to ground.

Figure 2:
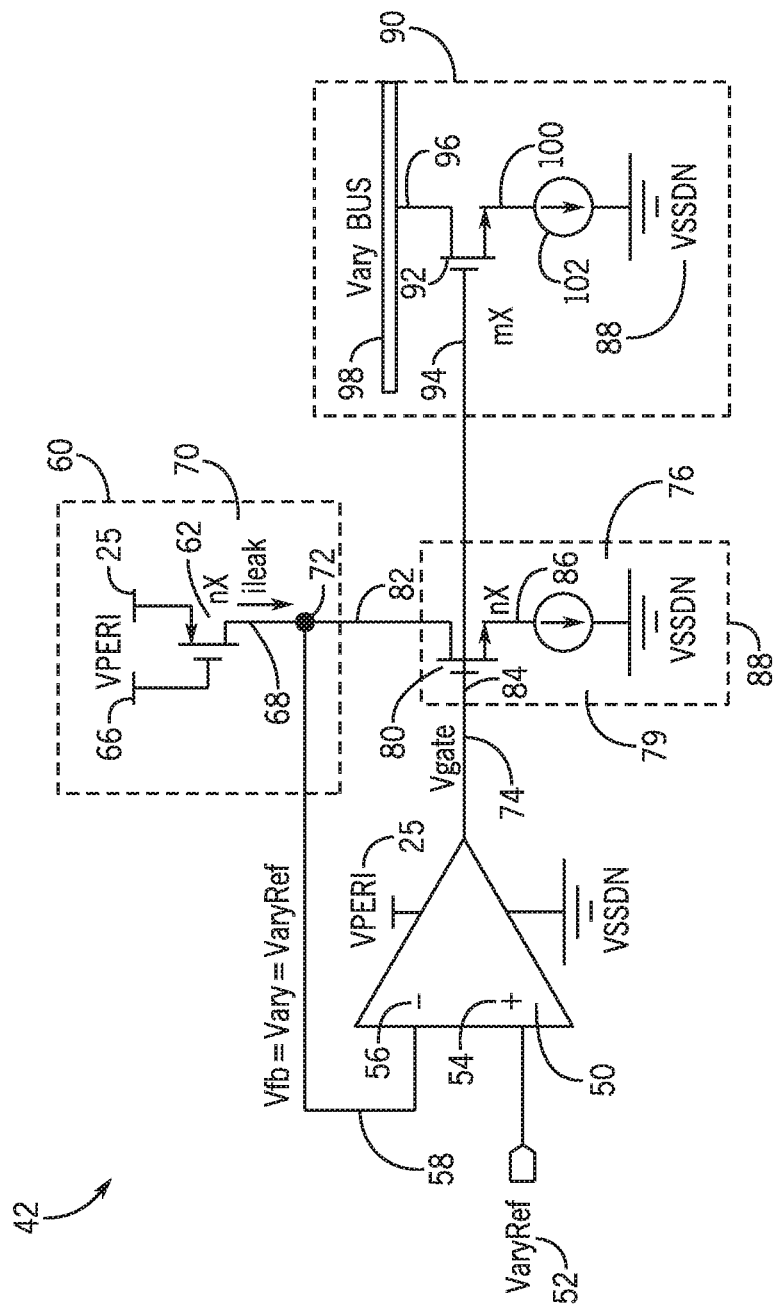
FIG. 2 is a schematic diagram of a bleeder circuit that may track leakage current across variations in process, voltage, and temperature (PVT) conditions, in accordance with an embodiment of the present disclosure.

FIG. 2 illustrates a bleeder circuit 42 that may facilitate discharge of the leakage current across variations in PVT conditions, in accordance with an embodiment of the present disclosure. The bleeder circuit 42 may include an operational amplifier 50 that is driven (e.g., powered) using the power supply potential VPERI (e.g., VDD) 25 generated external to the semiconductor device 10. Using VPERI 25 to drive the amplifier 50 as opposed to using an internally generated power supply potential, such as V may enhance power savings as VPERI 25 is generally of a lower voltage level than the internally generated power supply potentials.

The amplifier 50 may receive an array reference voltage ($V_{aryRef}$) 52 as an input into, for example, a positive input terminal 54 of the amplifier 50. The $V_{aryRef}$ 52 may be at a same voltage level (e.g., 1.0 volts) as the voltage of a power line bus (Vary, Vary Bus) used to transmit power generated by the power amplifier to other components within the semiconductor device 10. In some embodiments, the $V_{aryRef}$ 52 may be received at a negative input terminal 56 of the amplifier 50. Further, the amplifier 50 may also receive a feedback voltage ($V_{fb}$) 58 at the remaining input terminal, which in this case, is the negative input terminal 56 of the amplifier 50. The negative input terminal 56 may be coupled to a PMOS unit 60 that mimics the leakage current generated by, for example, eight PMOS transistors used in a single power amplifier.

Briefly, and as discussed above, the PMOS transistors of an amplifier may generate leakage current that should be transmitted to ground to prevent compromises on semiconductor device 10 performance during turn-off modes. In particular, in a turn-off mode, the amplifiers may be disabled by coupling the PMOS gate terminal and source terminal to a power supply. However, due to physics of the PMOS device, a relatively large leakage current (e.g., 100 uA-300 uA) may flow even when the PMOS is off. This leakage current may flow to the power line bus (Vary Bus), shifting the power line bus voltage (Vary) away from an intended voltage (e.g., 1 volt), reducing semiconductor device 10 performance. In some embodiments, the leakage current may include leakage current generated by multiple PMOS transistors (e.g., n=eight) of the power amplifier.

As such, by having the capability to mimic the leakage current generated by at least eight PMOS transistors of the power amplifier, the PMOS unit 60 may have enough current capacity to entirely transmit the leakage current to other portions of the bleeder circuit 42 and thus, eventually to ground. The PMOS unit 60, in particular, may include a PMOS transistor 62 with a source terminal 64 and a gate terminal 66 tied to the power source potential VPERI 25 in a similar configuration as the PMOSs in the power amplifier during turn-off mode. Further, the leakage current may flow at a drain terminal 68 of the PMOS transistor 62 may encompass n times the leakage current generated by a single PMOS in an amplifier. Thus, the leakage current of the power amplifier and the leakage current used by the bleeder circuit 42 may be effectively the same.

Because of the amplifier structure and the leakage current generated by the PMOS unit 60, a node 72 coupling the PMOS unit 60 and the negative input terminal 56 may have a potential that is the same as that of the power line bus voltage (e.g., Vary=$V_{aryRef}$). That is, the feedback voltage ($V_{fb}$) 58 may be the power line bus voltage (Vary). Reproducing the power line bus voltage (Vary) may be useful for tracking the leakage current 70 variations caused by changes in the PVT conditions since the power line bus voltage (Vary) level may also vary with changes in the PVT conditions. For example, bleeder circuit components that receive the power line bus voltage (Vary) as an input may sink current to ground in accordance with the magnitude of the leakage current 70, rather than oversinking or undersinking the leakage current, as will be discussed in greater detail below. In other words, this may facilitate the ability of the bleeder circuit 42 to dynamically track the leakage current variations across changes in PVT conditions and to match a sinking current to the leakage current.

Further, because the amplifier is part of a voltage follower structure, an output (e.g., Vgate) 74 of the amplifier 50 may be at an equivalent (e.g., follow) voltage level as the input 52 to the amplifier 50. That is, the output 74 and the negative input terminal 56 may be at a potential equivalent of $V_{aryRef}$ 52. In some embodiments, the $V_{aryRef}$ 52 and the output 74 may be 1.0 volts to 1.3 volts depending on the leakage current 70. In addition, because the amplifier 50 is a voltage follower amplifier, the amplifier 50 may act as a buffer between the PMOS unit 60 and electrical loads, thereby avoiding loading of the PMOS unit 60 by, for example, portions of the bleeder circuit 42 that discharge the leakage current.

The output 74 may be coupled to a mirroring NMOS unit 76 that mirrors the leakage current of the PMOS unit 60 without loading the PMOS unit 60. The mirroring NMOS unit 76 may include an NMOS transistor 80 with a source terminal 82 tied to the node 72, a gate terminal 84 tied to the output 74, and a drain terminal 86 tied to ground 88. Based at least in part on the gate terminal 84 being tied to the output 74, the mirroring NMOS unit 76 may exactly mirror the leakage current 70 of the PMOS unit 60 up to N times the leakage current generated by a single PMOS in the power amplifier. As such, the mirroring NMOS unit 76 may be thought of as a breaker circuit that exactly mirrors the behavior of the power amplifier PMOSs.

The mirroring NMOS unit 76 may be further coupled to a bleeder NMOS unit 90 that performs the discharge of the leakage current 70. In particular, the bleeder NMOS unit 90 may include a bleeder NMOS transistor 92 with a gate terminal coupled to an output of the mirroring NMOS unit 76, a source terminal 96 coupled to the power line bus (e.g., Vary Bus at a potential Vary) 98, and a drain terminal 100 coupled to ground 88. Due to the configuration of the terminals 94, 96, 100 of the NMOS transistor 92, a current mirror may form between the mirroring NMOS unit 76 and the bleeder NMOS unit 90 and thus, the leakage current 79 at the mirroring NMOS unit 76 may be mirrored to the bleeder NMOS unit 90, which has a higher current capacity to adequately sink the leakage current.

For example, when the leakage current 70 at the mirroring NMOS unit 76 includes eight times the leakage current of a single PMOS, a bleeder current 102 of the bleeder NMOS unit 90 may be capable of sinking current up to two hundred and fifty-six times the magnitude of the leakage current of a single PMOS and thus, thirty-two times the magnitude of the leakage current 70. The ability of the bleeder NMOS unit 90 to sink a greater magnitude of current 102 to ground 88 may be useful in memory device designs using a large number of power amplifiers as it ensures complete discharge of the leakage current 70. Further, because the bleeder current 102 may track the leakage current 70 across PVT conditions, including corner PVT cases, the bleeder NMOS unit 90 may dynamically adjust the amount of current transmitted to ground 88, avoiding charging or pulling down of the power line bus voltage (Vary). It should be appreciated that a greater or fewer number of components may be included in the bleeder circuit 42 than shown.

Figure 3:
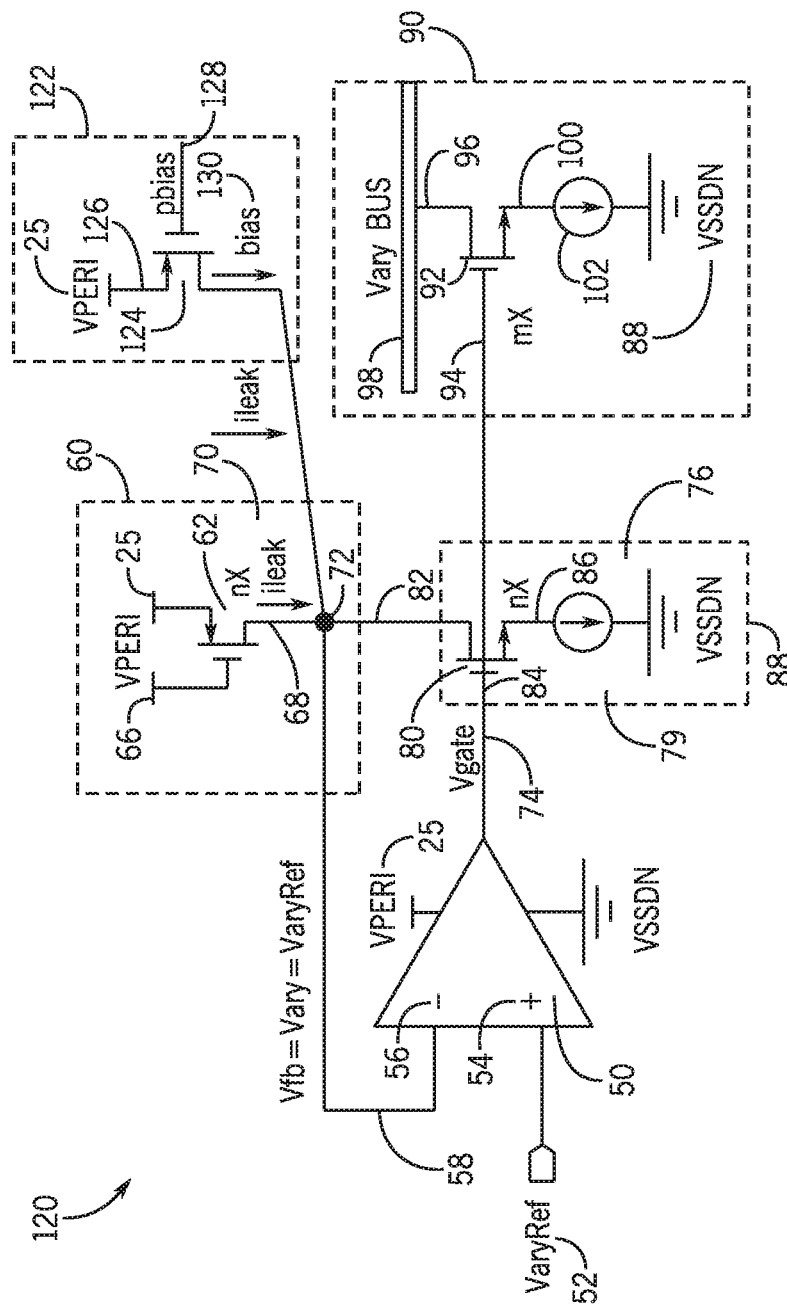
FIG. 3 is another schematic diagram of a bleeder circuit that may track leakage current across variations in the process, voltage, and temperature (PVT) conditions, in accordance with an embodiment of the present disclosure.

FIG. 3 illustrates another embodiment of a bleeder circuit 120 that may discharge the leakage current 70 across PVT conditions, in accordance with an embodiment. The bleeder circuit 120 may function in a similar manner as the bleeder circuit 42. In particular, the bleeder circuit 120 may generate the leakage current 70 that exactly matches the leakage current generated by PMOSs in the power amplifier, mirror the leakage current 70 to the mirroring NMOS unit 76, and discharge the leakage current 70 using the bleeder NMOS unit 90. The bleeder circuit 120 may also include a biasing PMOS unit 122 that may ensure that the amplifier 50 functions as intended. In particular, the biasing PMOS unit 122 may include a PMOS transistor 124 with a source terminal 126 coupled to VPERI 25, a gate terminal 128 that receives a gate biasing voltage to turn on the PMOS transistor 124, and a drain terminal 130 through which a biasing current flows 130.

In some embodiments, the biasing current may be less than 0.5 uA and may be used to bias the amplifier 50 to ensure proper functionality in all cases, such as corner cases of PVT conditions. When the leakage current 70 is below a current threshold, the biasing current may be used to bias (e.g., turn-on) the amplifier 50 to ensure proper functionality. When the leakage current 70 is above the current threshold, the biasing current may not be needed to bias the amplifier 50 and instead may be optioned out. When the biasing PMOS unit 122 is included as part of the bleeder circuit 120, the bleeder current 102 may include an amplification of the leakage current and of the bias current. For example, the bleeder current 102 magnitude may be equivalent to 32×Leakage current 70 plus 32×Bias current.

Figure 4:
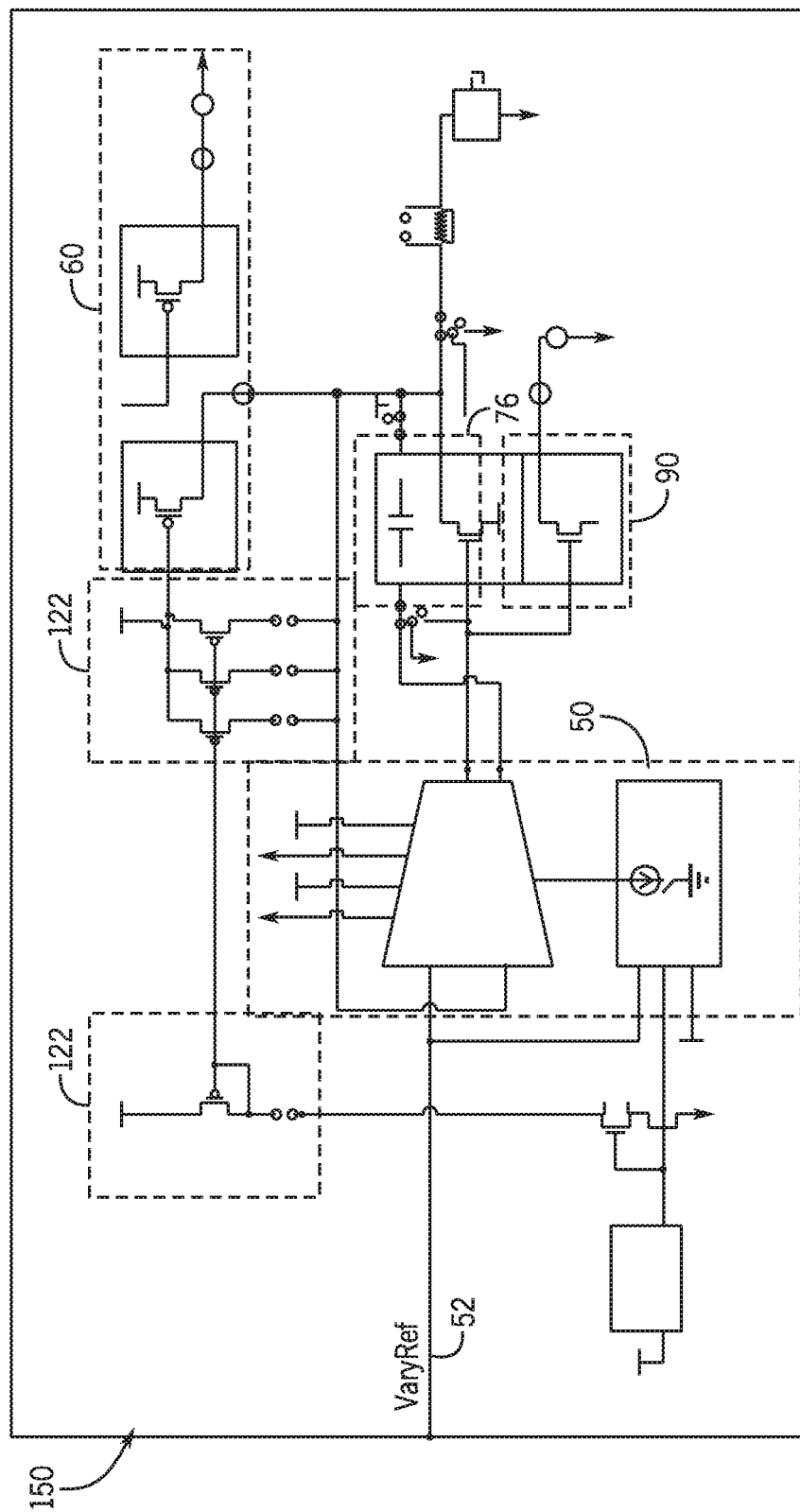
FIG. 4 is a schematic diagram of a simulated bleeder circuit, in accordance with an embodiment of the present disclosure.

FIG. 4 illustrates a bleeder circuit layout 150 that is used to simulate the operations of the bleeder circuit 120, in accordance with an embodiment of the present disclosure. As shown, the bleeder circuit layout 150 may include the amplifier 50 that receives the $V_{aryRef}$ 52 input. The amplifier 50 may be coupled to the biasing PMOS unit 122, which may provide biasing currents to ensure proper operations of the amplifier 50. Further, the amplifier 50 may be coupled to the PMOS unit 60 that mimics the leakage current of the power amplifier. The PMOS unit 60 and the amplifier 50 may both be coupled to the mirroring NMOS unit 76 used to mirror the leakage current 70 of the PMOS unit 60. In addition, the mirroring NMOS unit 76 may be coupled to the bleeder NMOS unit 90 used to discharge the leakage current 70.

The simulation of the bleeder circuit 42 may be used to test stability and functionality of the bleeder circuit design. For example, the simulation may confirm that the bleeder current 102 is greater than the leakage current 70 under all PVT conditions, such as corner cases of −40° C. and 130° C., since temperature variations may significantly vary the leakage current magnitude. Further, the simulation may be used to confirm that the design does not cause the amplifier 50 to oscillate across a range of PVT conditions. When the amplifier 50 does not oscillate, the design is considered stable. In addition, the simulation may be used to evaluate a voltage ramp up of the amplifier 50 under various PVT conditions.

Embodiments of the present disclosure relate to discharging the leakage current 70 generated during standby and/or power down modes regardless of variations in PVT conditions. By implementing the bleeder circuit 42 using transistor units and an operational amplifier, the bleeder circuit 42 may be implemented with a lower cost, design complexity, and area consumption than bleeder circuits that use temperature sensors and/or resistors to discharge the leakage current generated by the power amplifier. Further, the bleeder circuit 42 may enable automatic tracking of the leakage current generated by the power amplifier across PVT conditions, allowing for appropriate discharge of the leakage current 70 without affecting the power line bus voltage (Vary). Additionally, the design of the bleeder circuit 42 may be stable and may sink the leakage current 70 under nearly all testable PVT conditions.

While the present disclosure may be susceptible to various modifications and alternative forms, specific embodiments have been shown by way of example in the drawings and have been described in detail herein. However, it should be understood that the present disclosure is not intended to be limited to the particular forms disclosed. Rather, the present disclosure is intended to cover all modifications, equivalents, and alternatives falling within the spirit and scope of the present disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. An apparatus, comprising:
a bleeder circuit, comprising:
leakage current mirroring circuitry, wherein the leakage current mirroring circuitry is configured to mirror a first current associated with a leakage current associated with the apparatus; and
leakage current bleeder circuitry coupled to the leakage current mirroring circuitry, wherein the leakage current bleeder circuitry is configured to sink the leakage current to ground.

2. The apparatus of claim 1, wherein the bleeder circuit comprises an operational amplifier positioned in a voltage follower structure.

3. The apparatus of claim 2, wherein the leakage current mirroring circuitry is configured to be driven by an output of the operational amplifier.

4. The apparatus of claim 1, wherein a power generation unit is configured to generate the leakage current associated with the apparatus.

5. The apparatus of claim 4, wherein the leakage current generated by the power generation unit comprises current flowing through transistors of one or more power amplifiers of the power generation unit when the apparatus is in a turned-off mode.

6. The apparatus of claim 4, wherein the first current comprises a leakage current that is eight times a magnitude of a leakage current generated by a transistor of the power generation unit.

7. The apparatus of claim 1, wherein the bleeder circuit comprises leakage current generator circuitry, wherein the leakage current generator circuitry is configured to generate the first current.

8. The apparatus of claim 7, wherein the leakage current generator circuitry is configured to communicatively couple to the leakage current mirroring circuitry, wherein the leakage current mirroring circuitry is configured to mirror the first current.

9. The apparatus of claim 7, wherein the leakage current generator circuitry comprises a P-type metal-oxide-semiconductor (PMOS) transistor, wherein a gate terminal of the PMOS transistor and a source terminal of the PMOS transistor are coupled to an external potential supply source, and wherein a drain terminal of the PMOS transistor is coupled to the input terminal of the leakage current mirroring circuitry.

10. The apparatus of claim 7, wherein the leakage current mirroring circuitry is configured to prevent loading of the leakage current generator circuitry.

11. The apparatus of claim 1, wherein the leakage current mirroring circuitry comprises an N-type metal-oxide-semiconductor (NMOS) transistor.

12. The apparatus of claim 1, wherein the leakage current bleeder circuitry comprises an N-type metal-oxide-semiconductor (NMOS) transistor, wherein a gate terminal of the NMOS transistor is coupled to the leakage current mirroring circuitry, wherein a source terminal of the NMOS transistor is coupled to a power line bus, and wherein a drain terminal of the NMOS transistor is coupled to a ground.

13. The apparatus of claim 1, wherein the second current comprises a bleed current that is thirty-two times a magnitude of the first current.

14. The apparatus of claim 1, wherein the apparatus comprises a high-bandwidth memory (HBM) device.

15. A method for discharging a leakage current, comprising:
receiving, by leakage current mirroring circuitry, a first current indicative of a leakage current occurring when an electronic device is in a turn-off mode; and
generating, by leakage current mirroring circuitry, a second current that traces the first current; and
generating, by leakage current bleeder circuitry, a third current that sinks the leakage current to ground.

16. The method of claim 15, comprising generating the first current by leakage current generator circuitry.

17. A bleeder circuit, comprising:
leakage current mirroring circuitry configured to generate a second current that mirrors a first current received, wherein the first current is indicative of a leakage current; and
leakage current bleeder circuitry coupled to the leakage current mirroring circuitry, wherein the leakage current bleeder circuitry is configured to generate a third current of a greater magnitude than the second current, wherein the third current facilitates discharging of the leakage current.

18. The bleeder circuit of claim 17, wherein the bleeder circuit comprises a voltage follower amplifier.

19. The bleeder circuit of claim 18, wherein the bleeder circuit comprises leakage current generator circuitry coupled to the voltage follower amplifier, wherein the leakage current generator circuitry is configured to generate a first current that mimics leakage current generated by one or more power amplifiers.

20. The bleeder circuit of claim 17, wherein the bleeder circuit comprises biasing circuitry coupled to an output of a voltage follower amplifier, wherein the biasing circuitry is configured to generate a biasing current for the voltage follower amplifier when the first current generated by the leakage current generator circuitry is less than a threshold.

* * * * *